United States Patent [19]
Yamahata et al.

[11] Patent Number: 5,465,257
[45] Date of Patent: Nov. 7, 1995

[54] TEST SIGNAL OUTPUT CIRCUIT IN LSI

[75] Inventors: Hitoshi Yamahata; Masahiro Kusuda, both of Tokyo, Japan

[73] Assignee: NEC Corporation, Tokyo, Japan

[21] Appl. No.: 25,966

[22] Filed: Mar. 3, 1993

[30] Foreign Application Priority Data

Mar. 3, 1992 [JP] Japan ..................................... 4-045084

[51] Int. Cl.$^6$ .................................................. G01R 31/28
[52] U.S. Cl. ......................................... 371/22.5; 371/22.6
[58] Field of Search ................................... 371/15.1, 20.1, 371/22.3, 22.5, 22.6; 365/200

[56] References Cited

U.S. PATENT DOCUMENTS 5,077,740  12/1991  Kanuma ................................. 371/22.3

OTHER PUBLICATIONS

*Structured Computer Organization* Third Edition by Andrew S. Tanenbaum ©1990 by Prentice–Hall Inc. pp. 162–178.

Daniel P. Siewiorek et al. "Computer Structures: Principles and Examples" McGraw Hill, New York, 1982 pp. 588, 635–637.

Intel Corporation, *i860*™ *64–Bit Microprocessor,* Oct. 1989.

*Primary Examiner*—Vincent P. Canney

[57] ABSTRACT

An object of the present invention is to reduce the number of external connection terminals of an LSI that are required for performing testing in an operating state. The test signal output circuit of the present invention comprises one or more test signal output terminals, one or more test mode signal input terminals, a decoder for interpreting signals from the test mode signal input terminals, and one or more selectors for selecting internal signals in response to the output of the decoder and outputting the selected signals from the respective test signal output terminal.

2 Claims, 12 Drawing Sheets

TEST SIGNAL OUTPUT CIRCUIT IN LSI

BACKGROUND OF THE INVENTION

1. Field of the Invention

The present invention relates to a test signal output circuit provided in an LSI (Large Scale Integrated Circuit).

2. Description of the Related Art

Highly integrated LSIs are currently being manufactured owing to the remarkable progress in semiconductor technology, minute parts processing technology and system technology. Such a high degree of integration was unimaginable only a decade age. It is now possible to accommodate electronic circuits with as many as 30 thousand gates in a ceramic case only 2.8 cm×0.7 cm in size. As a result, it has become possible to mount an arithmetic processor for calculating trigonometric function or a memory of 16 mega bits on a single chip.

However, at the same time, the accelerated high integration of circuits of this kind has made it more difficult to evaluate or test an LSI, because, though a large number of circuits for complex arithmetic can be accommodated in a high-density arrangement, there is an unavoidable limit to the number of external connection terminals that can be accommodated in the same space. In other words, it is impossible to evaluate or test the large number of circuits only by observation of signals from the external connection terminals which are available for users. Before packaging an LSI, signal waveforms of a designated portion inside the LSI can be observed through a method which employs a probe; however, this method is naturally neither applicable to the testing of already packaged products, such as products returned by users, nor is it applicable to minute products before packaging due to the progress of miniaturization of the internal wiring that has accompanied the advancement of the high integration of LSIs. Therefore, it is indispensable to provide test signal output means which will allow observation at the external connection terminals of signal waveforms of designated portions inside LSI.

One conventional test signal output circuits of this type comprises, in addition to the normal external connection terminals, a plurality of test signal output terminals not available for users. These test signal output terminals are connected to the designated portions inside the LSI whose signal waveforms must be observed.

Another conventional test signal output circuit of this type responds to test mode signals supplied to test mode signal input terminals to switch the LSI from normal operating mode to test mode and uses normal external connection terminals for outputting test signals while the circuit is in test mode.

The former of the above conventional techniques requires the provision of a plurality of exclusive test terminals on the surface of the LSI in addition to normal external connection terminals, and hence it has the drawbacks that it not only reduces the degree of integration of the LSI, but also requires an increased number of terminals corresponding to the number of test signals. In the case of the latter technique, there are the drawbacks that it is incapable of outputting normal signals during test mode of the circuit and also entails a prolonged mode switching time according to the composition of the test mode signals.

SUMMARY OF THE INVENTION

An object of the present invention is to provide a test signal output circuit which transmits signals in a test mode from the fixed portion of an LSI in operating state to outside the LSI without affecting normal output signals in the above operating state.

Another object of the present invention is to provide a test signal output circuit which transmits signals in a test mode from a fixed portion of the LSI in operating state to outside the LSI through a minimum number of test signal output terminals without affecting the above normal output signals.

The test signal output circuit of an LSI of the present invention for achieving the above purposes comprises:
- at least one test signal output terminal,
- at least one test mode signal input terminal, and
- at least one selector for transmitting the fixed internal signals selectively to said test signal output terminal responding to input signals directed to said test mode signal input terminal.

In this case, a decoder may also be provided which interprets signals from said test mode signal input terminal, and at least one selector may also be provided for transmitting the fixed internal signals selectively to said test signal output terminal responding to the output signals of said decoder.

It is also within the scope of the invention to compose the circuit so as to include a number "n" of said test signal output terminals and a number "m" of said test mode signal input terminals, to make said decoder output a quantity $2^m$ from input m, and to have each of the number n of said selectors receive input $2^m$, such that a number $2^m \times n$ kinds of internal signals appear selectively from said fixed internal signals on said test signal output terminals.

Further, it is also within the scope of this invention to provide test signal output terminals for directly taking out internal signals.

Furthermore, it is possible for the test signal output circuit of LSI of the present invention to comprise:
- signal terminals structured in a timesharing manner for a combined use of at least a part of said test signal output terminals and said test mode signal output terminals;
- a trailing edge detection circuit for detecting the trailing edge of a reset signal for resetting the entire LSI;
- an input-output switching circuit for switching said signal terminals responding to trailing edges detected by said trailing edge detection circuit to a test mode signal input mode which receives test mode signals and a test mode signal output mode which outputs test signals,
- a latched circuit for withholding the output of said decoder or test mode signals from said test mode signal input terminals and responding to the output of said trailing edge detection circuit;

and to arrange the circuit so as to control the output of said selector in response to the output of said latched circuit.

Still further, it is also possible for the LSI test signal output circuit of the present invention to comprise:
- signal terminals composed in a timesharing manner for combined use of at least a part of the designated normal terminals and said test mode signal input terminals,
- a trailing edge detection circuit for detecting the trailing edge of a reset signal for resetting the entire LSI,
- an input-output switching circuit for switching said signal terminals responding to trailing edges detected by said trailing edge detection circuit to a test mode signal input mode which receives test mode signals and a normal mode for transmitting-receiving normal signals,
- a latched circuit for holding the output of said decoder or test mode signals from said test mode signal input terminals in response to the output of said trailing edge detection circuit, and to arrange the circuit so as to control the output of said selector in response to the output of said latched circuit.

In the present invention constituted as described above, under normal operating mode other than test mode in which the above test mode signals are inputted, the above test signal output terminal, test mode signal input terminal, decoder, and selector are all in a non-operating state such that normal input-output signals can be outputted through the normal external connection terminals.

The above and other objects, features, and advantages of the present invention will become apparent from the following description taken in conjunction with the accompanying drawings which illustrate an example of a preferred embodiment of the present invention.

DETAILED DESCRIPTION OF THE PREFERRED EMBODIMENTS

Figure 1:
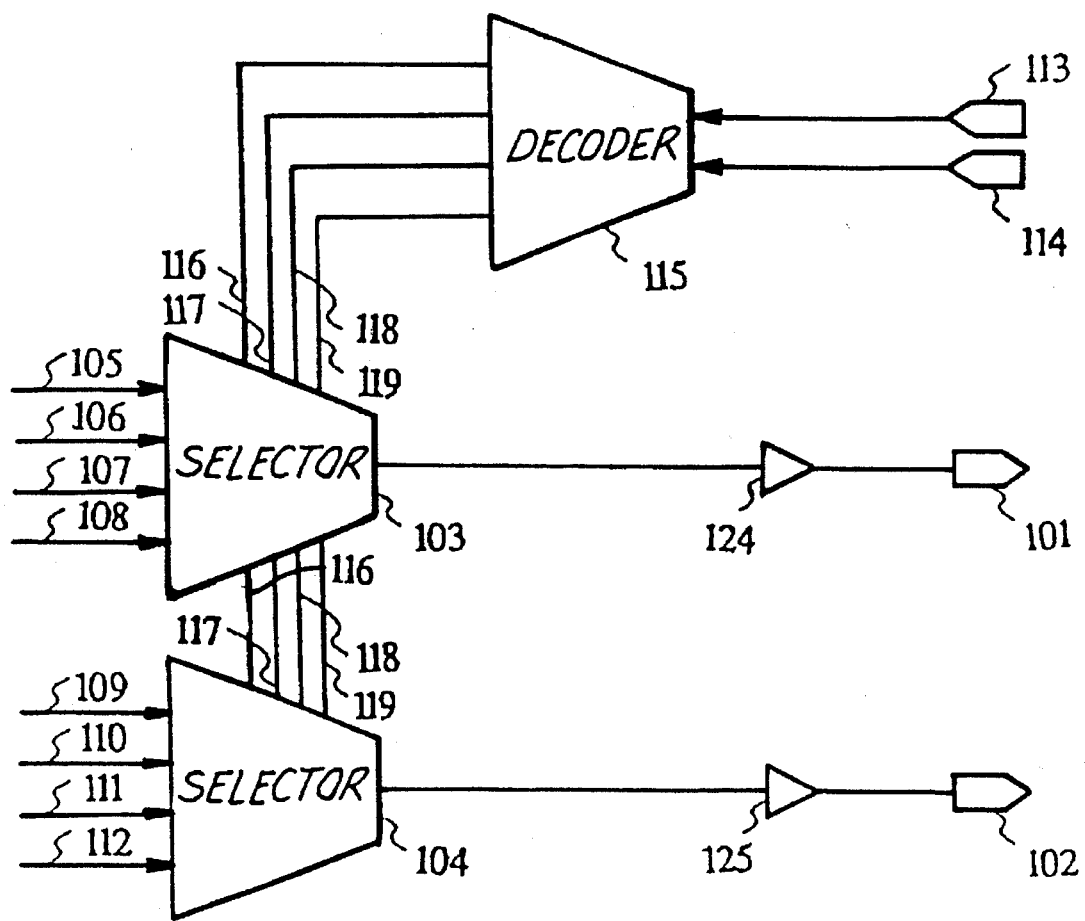
FIG. 1 is a circuit diagram of a first embodiment of the present invention

Though the test signal output circuit of the first embodiment of the present invention shown in FIG. 1 is formed on the surface of an LSI (not shown) by a technique of common knowledge, it is formed in exceedingly small scale compared to a nucleus circuit (not shown) for controlling the primary function of the LSI.

The present embodiment is composed of two test signal output terminals 101 and 102, two test mode signal input terminals 113 and 114, a decoder 115 for interpreting test mode signals from these input terminals, and two selectors 103, 104 for supplying internal signals from a fixed portion (described later) inside the LSI to said output terminals through output gates 124, 125, respectively, in response to the output of the decoder 115.

The decoder 115 interprets test mode signals of two bits from test mode signal input terminals 113, 114 and generates four decoder outputs 116 to 119. The selectors 103 and 104 output the internal signal of the LSI which appears as one of the above internal signals 105 to 108 and 109 to 112 from the test signal output terminals 101 and 102 selectively through output gates 124 and 125 in response to decoder outputs 116 to 119. The test signal output terminals 101, 102 and test mode signal input terminals 113, 114 are all test terminals exclusively and are parts of the external connection terminals of the LSI (external connection terminals for input-output of normal signals to the LSI are not shown).

Figure 2:
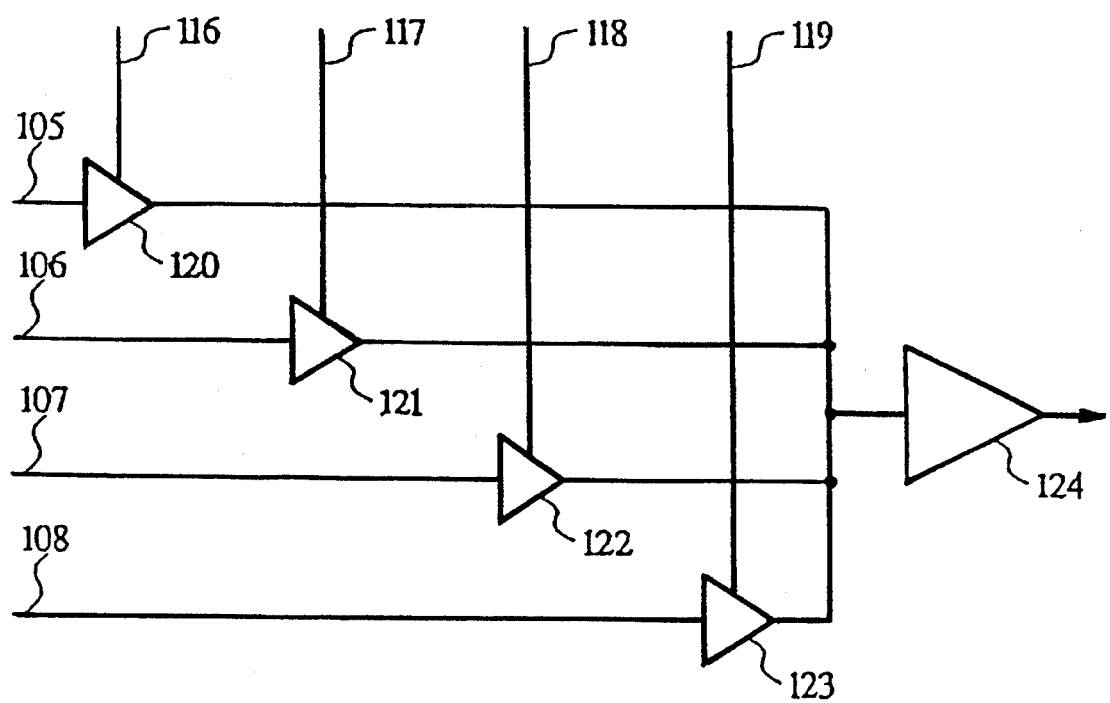
FIG. 2 is a circuit diagram showing a part of the first embodiment in detail.

Internal signals 105 to 112 are signals from the fixed portion of the LSI whose signals need be tested such as Micro Code ROM or Nanocode ROM in the floating-point arithmetic portion or PLA in Exception Decoder (regarding the details of this processor, reference may be made to *JOURNAL OF SOLID-STATE CIRCUITS*, Vol. 24, No. 5, OCTOBER 1989, p. 1326, FIG. 2).

The LSI is tested by this circuit in an operating state by inputting a parallel two-bit test mode signal into the test mode signal input terminals 113 and 114. The decoder 115 turns one of the decoder outputs 116 to 119 to "1" in response to this test mode signal of two bits.

From among internal signals 105 to 108, the internal signal corresponding to decoder output "1" is outputted to test signal output terminal 101 via output gate 124.

Similarly, selector 104 selectively outputs the internal signal corresponding to output "1", which is one of the decoder outputs 116 to 119, to test signal output terminal 102 through output gate 125.

As shown in detail in FIG. 2, selector 103 is composed of four sets of three-state-gate circuits 120 to 123 which receive decoder outputs 116 to 119 at respective control signal input terminals and which are connected in parallel to the above respective designated portions of the LSI, and outputs of these gate circuits are inputted to output gate 124 after being processed by wired OR processing. The other selector 104 is not shown since it has the same composition.

Three-state-gates 120 to 123 turn "OFF" for internal signals 105 to 108 when control input signals from decoder outputs 116 to 119 are "0", and turn "ON" when The decoder outputs are "1", selectively outputting one of internal signals 105 to 108.

As described above, by providing four additional test terminals, that is, two test mode signal input terminals 113, 114 and two test signal output terminals 101, 102, the embodiment of FIG. 1 can observe eight kinds of internal signals of the LSI in the operating state at the test signal output terminals, and can also observe any two of these internal signals simultaneously.

Figure 3:
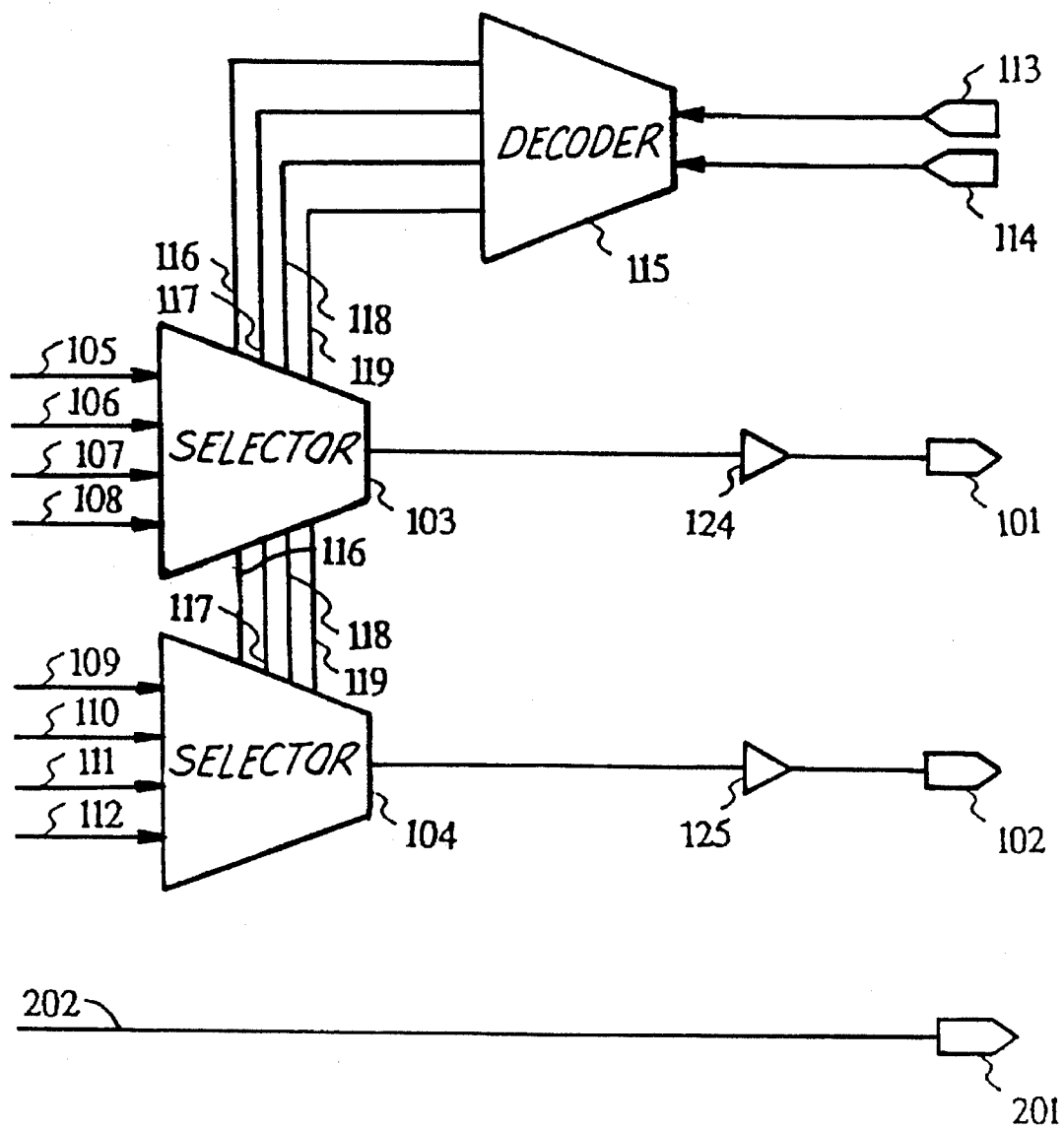
FIG. 3 is a circuit diagram of a second embodiment of the present invention.

In the second embodiment of the present invention shown in FIG. 3, components common to those of the first embodiment are represented with the same reference numerals. As is clearly shown in FIG. 3, the second embodiment differs from the first embodiment only in that it has an additional test signal output terminal 201 provided for directly transmitting internal signal 202. This composition is suited to directly outputting internal signals with high bit rates to test signal output terminals. However, as described above, although the number of test signal output terminals for direct output can be further increased at need, the degree of integration of the LSI is degraded as the number of the terminals increases.

Figure 4:
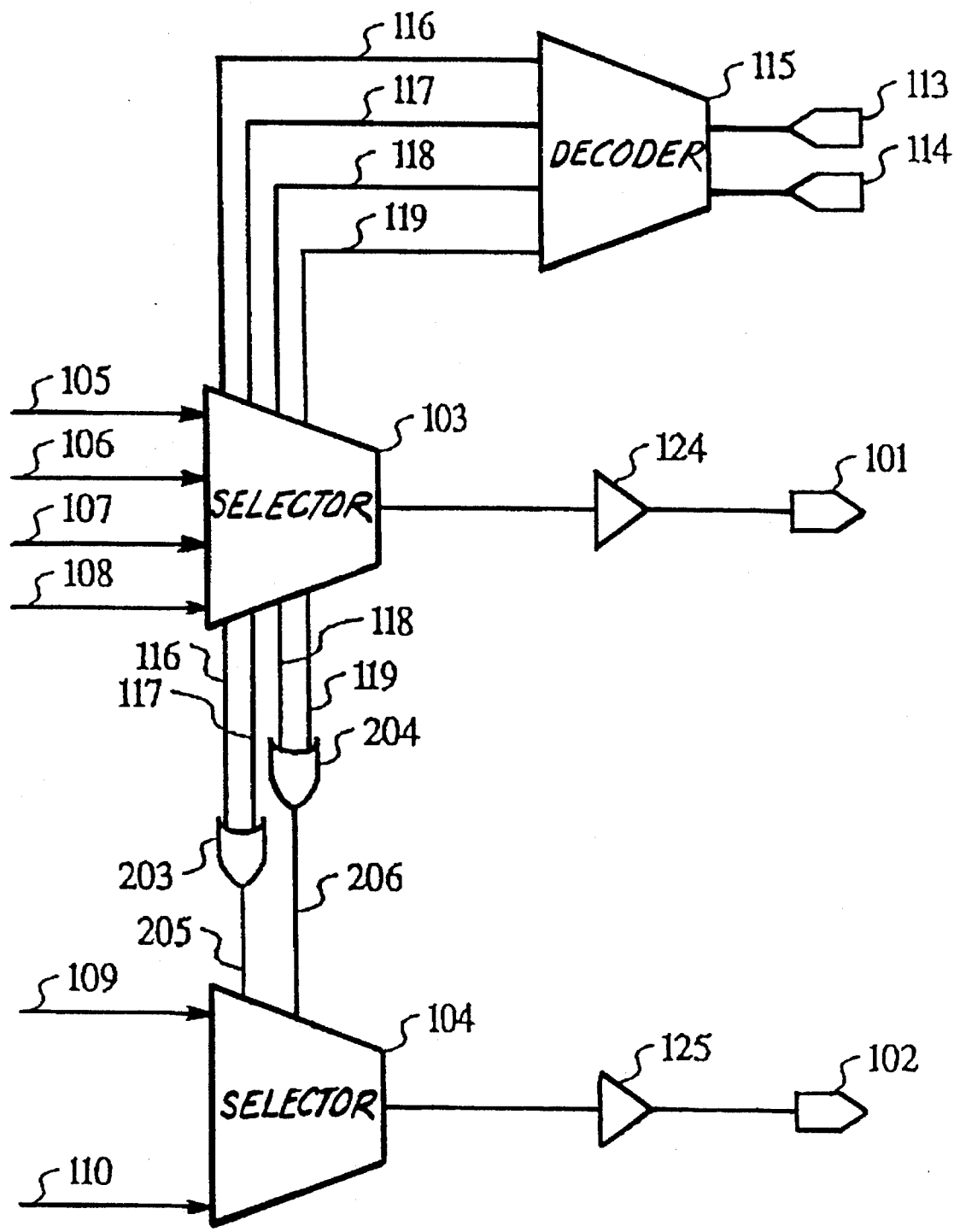
FIG. 4 is a circuit diagram of a third embodiment of the present invention.

In the third embodiment of the present invention shown in FIG. 4, decoder outputs 116 to 119 are transferred between selectors 103 and 104 not through direct connection between the two, but through two OR circuits 203 and 204. In other words, the third embodiment differs from the first and second embodiments in that OR circuit 203 transmits OR output 205 by receiving decoder outputs 116 and 117 and OR circuit 204 transmits OR output 206 by receiving decoder outputs 118 and 119 for inputting them respectively into the control signal input terminals of selector 104.

With this structure, selector 104 selects internal signal 109 when decoder output 116 or 117 is "1" and selects internal signal 110 when decoder output 118 or 119 is "1".

According to the present invention, a combination of internal signal 109 and internal signal 105 or 106, or a combination of internal signal 110 and internal signal 107 or 108 can be selectively and simultaneously output as the test signal.

Figure 5:
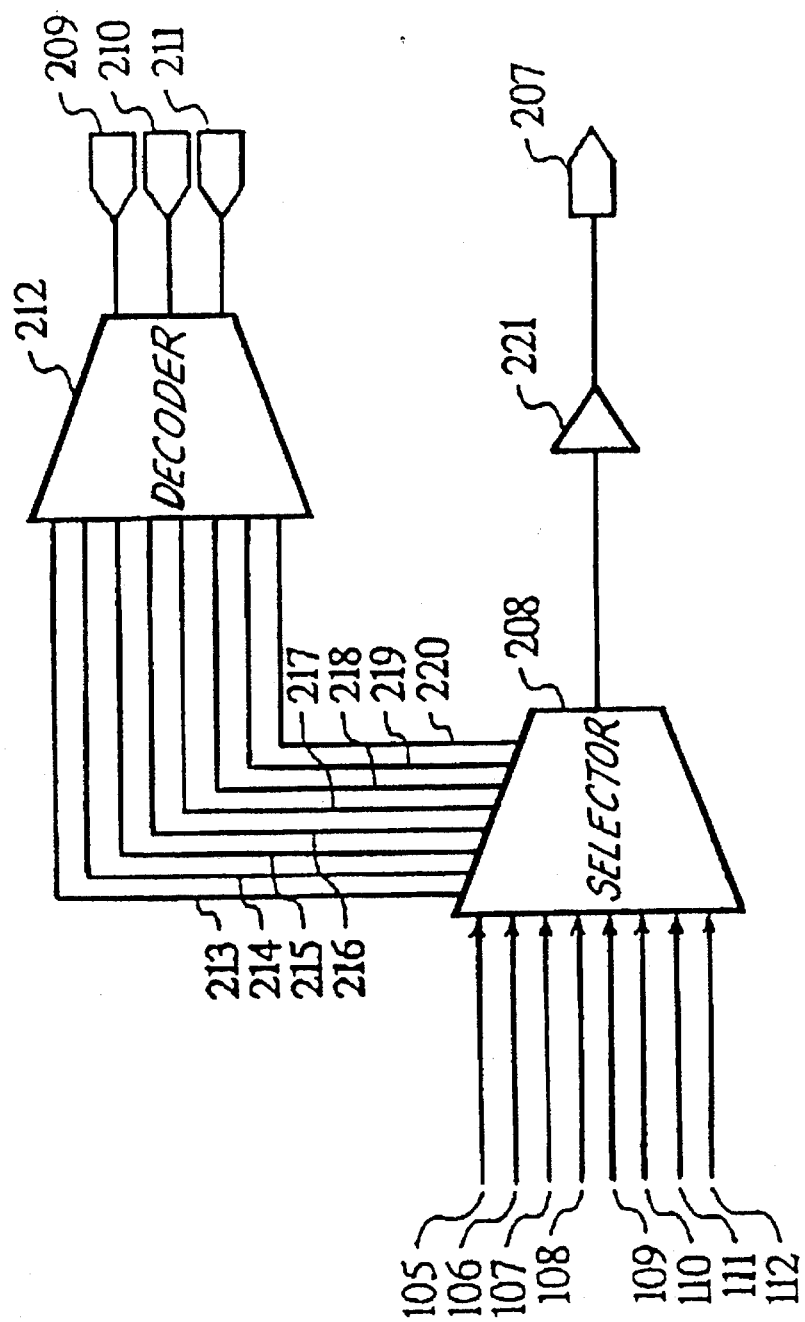
FIG. 5 is a circuit diagram of a fourth embodiment of the preset invention.

In the fourth embodiment of the present invention shown in FIG. 5, a test mode signal is composed of parallel three-bit signals. Accordingly, a decoder 212 with three inputs and eight outputs and a selector 208 with eight inputs and one output are used in place of decoder 115 and selectors 103, 104, respectively.

The Selector 208 responds if any one of the eight outputs 213 to 220 of the decoder 212 is "1" and outputs one of eight internal signals 105 to 112 selectively from test signal output terminal 207 through output gate 221. This embodiment is suited for transmitting internal signals with low bit rates and thereby permits testing in a timesharing method.

Figure 6:
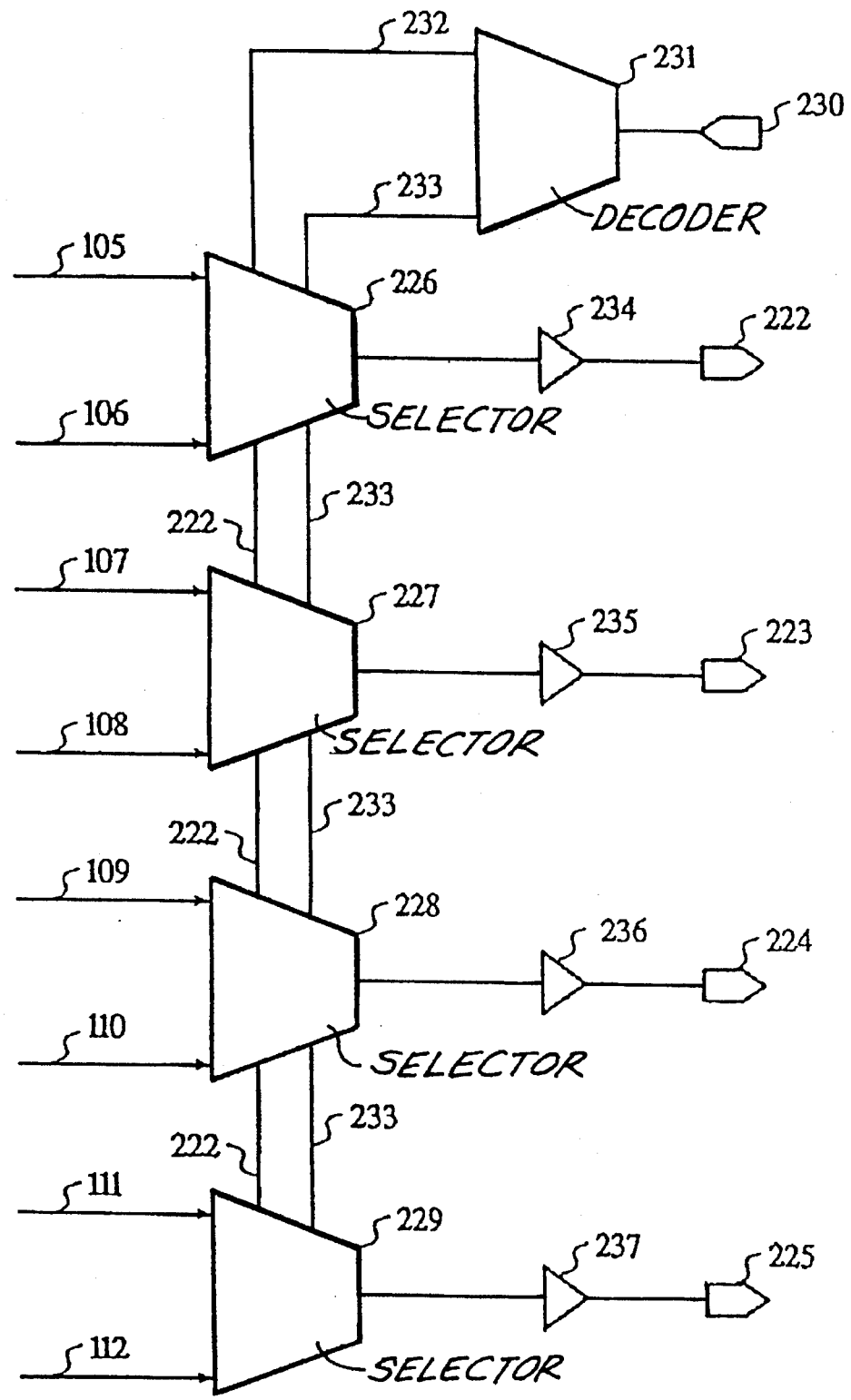
FIG. 6 is a circuit diagram of a fifth embodiment of the present invention.

In the fifth embodiment shown in FIG. 6, two outputs 232 and 233 of one input decoder 231 which receives test mode signals from test mode signal input terminal 230 are inputted into the respective control signal input terminals of four selectors 226 to 229.

Each of the selectors 226 to 229 responds to decoder outputs 232 and 233 and selectively transmits one signal from each of the respective pairs of internal signals 105 and 106, 107 and 108, 109 and 110, 111 and 112 to their respective test signal output terminals 222 to 225 through their respective output gates 234 to 237. This composition is suitable for cases in which a relatively large number of internal signals have to be outputted in parallel for testing.

Figure 7:
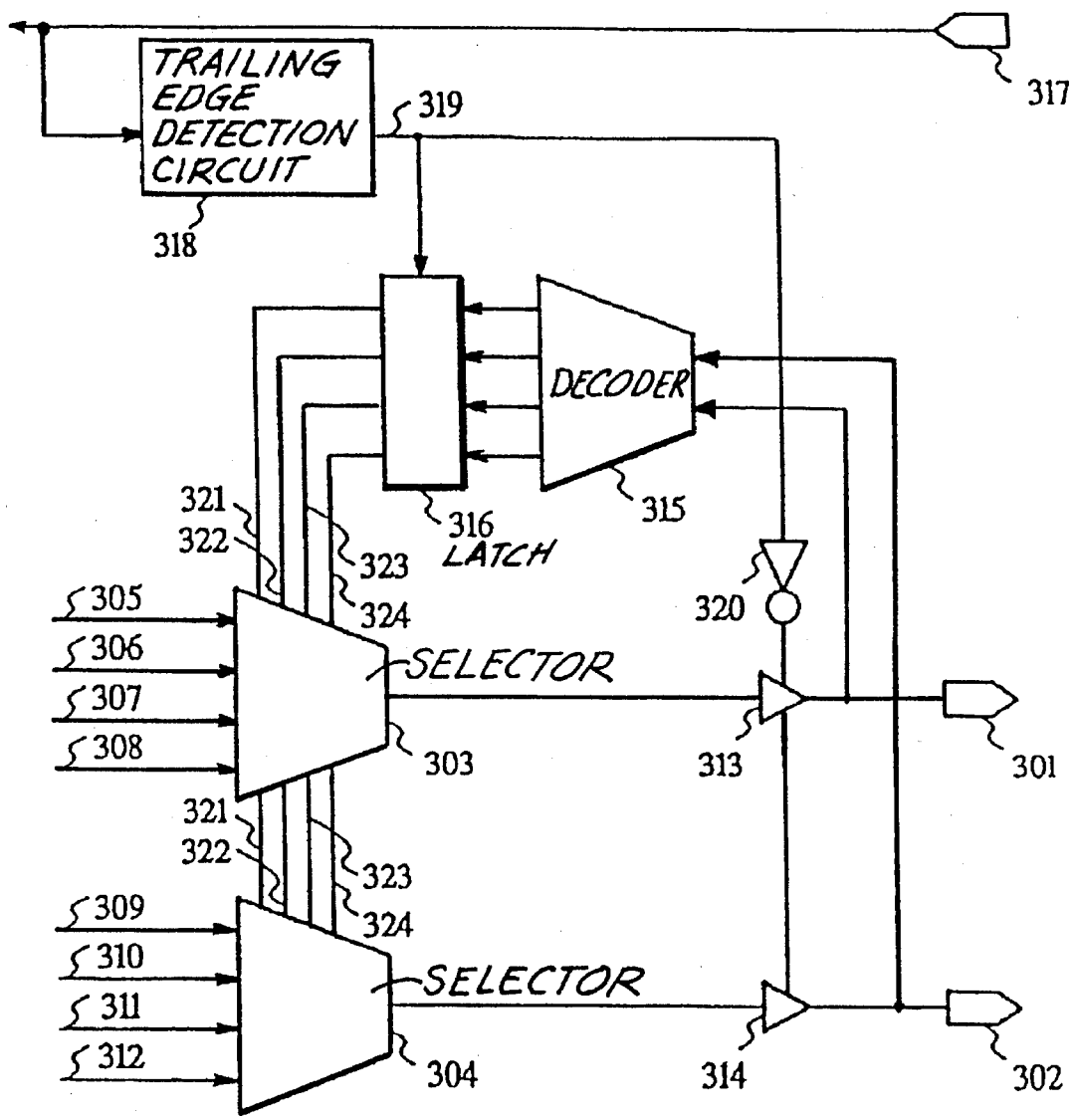
FIG. 7 is a circuit diagram of a sixth embodiment of the present invention.

The sixth embodiment of the present invention shown in FIG. 7 comprises two test signal input-output terminals 301 and 302 for combined use as a test signal output terminal and a test mode signal input terminal, a reset signal input terminal 317, a trailing edge detection circuit 318 which responds to the trailing edge of a reset signal, a decoder 315 which receives test mode signals from the input-output terminals, two selectors 303 and 304 that receive the output of the decoder 315 through latch 316, and two three-state-buffers 313 and 314 that receive the output of the trailing edge detection circuit 318 via an inverter 320 and transmits the outputs of the selectors 303 and 304 to the input-output terminals 301 and 302, respectively.

As shown in the figure, this embodiment has a structure in which the trailing edge detection circuit 318, latch 316, inverter 320 and three-state-buffers 313 and 314 are added to the first embodiment. The trailing edge detection circuit 318, inverter 320 and three-state-buffers 313 and 314 constitute an input-output switching circuit. The reset terminal 317 that is originally provided in this LSI is used as it is.

The trailing edge detection circuit 318 responds to the trailing edge of a reset signal (reset signal for the entire LSI) of the reset terminal 317 and supplies a latch signal 319 (for only one clock, "1") to the latch 316 and inverter 320. The inverter 320 inverts the signal 319 to "0" and outputs it to the three-state-buffers 313 and 314, as a result of which, the three-state-buffers 313 and 314 turn "OFF" and change the input-output terminals 301 and 302 to signal input mode.

On the other hand, the decoder 315 decodes test mode signals transmitted from the input-output terminals 301 and 302, and the latch 316 which receives these decoded outputs latches the same response to the above latch signal 319. The outputs 321 to 324 of the latch 316 are inputted into the control signal input terminals of selectors 303 and 304.

The selectors 303 and 304 transmit one of the internal signals 305 to 308 and one of the internal signals 309 to 312, respectively, to the respective three-state-buffer 313 and 314 in response to these latch outputs 321 to 324. When the output of the inverter 320 becomes "1", that is, when latch output 319 is not produced, these buffers 313 and 314 enter a low impedance state and supply the outputs of the selectors 303 and 304 to the input-output terminals 301 and 302.

Figure 8:
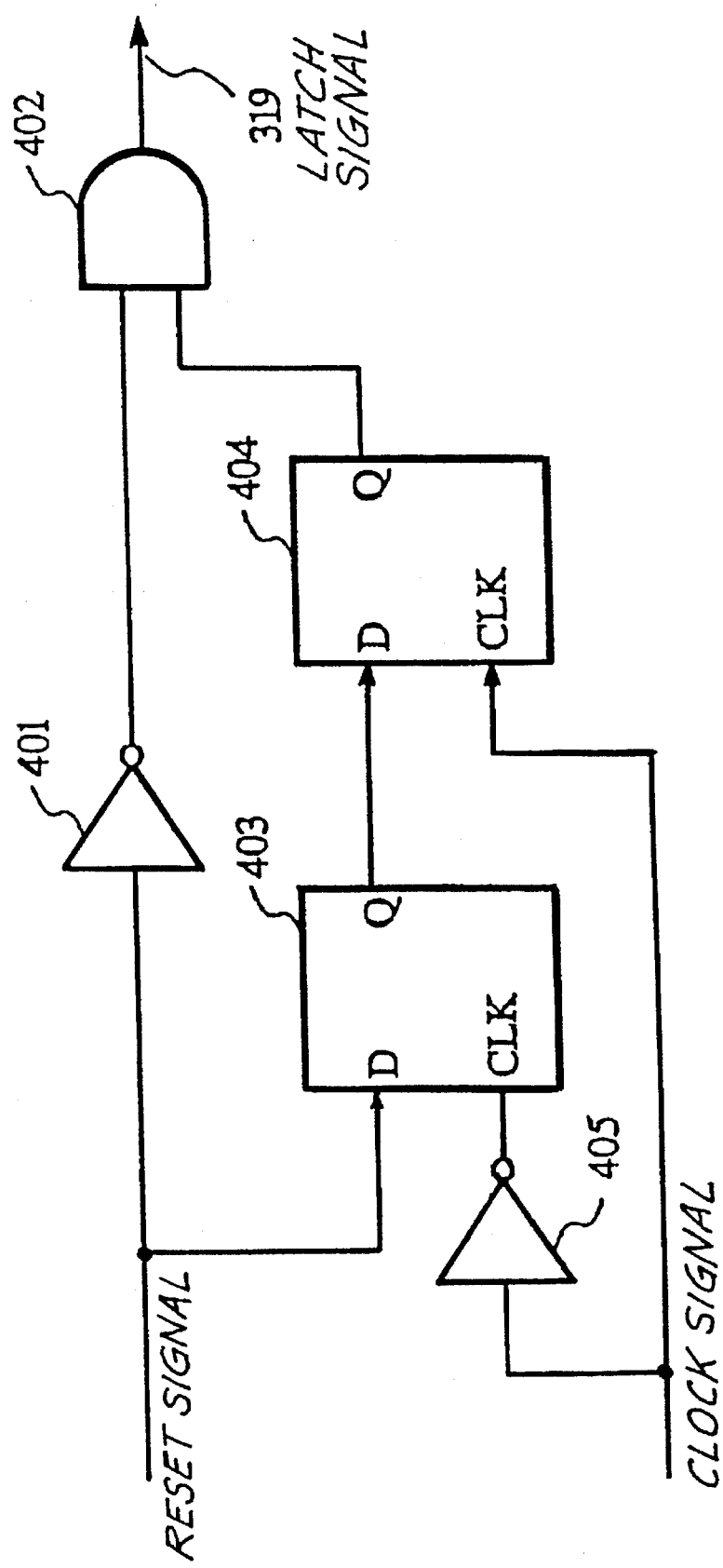
FIG. 8 is a circuit diagram showing a part of the sixth embodiment in detail.

As shown in detail in FIG. 8, the trailing edge detection circuit 318 comprises two inverters 401 and 405, an AND gate 402, and two D flip-flops 403 and 404.

Reset signals from the reset terminal 317 are supplied to the trailing edge detection circuit 318 and to the input terminal on one side of the AND gate 402 through one inverter 401 and also to one D flip-flop 403.

Figure 9:
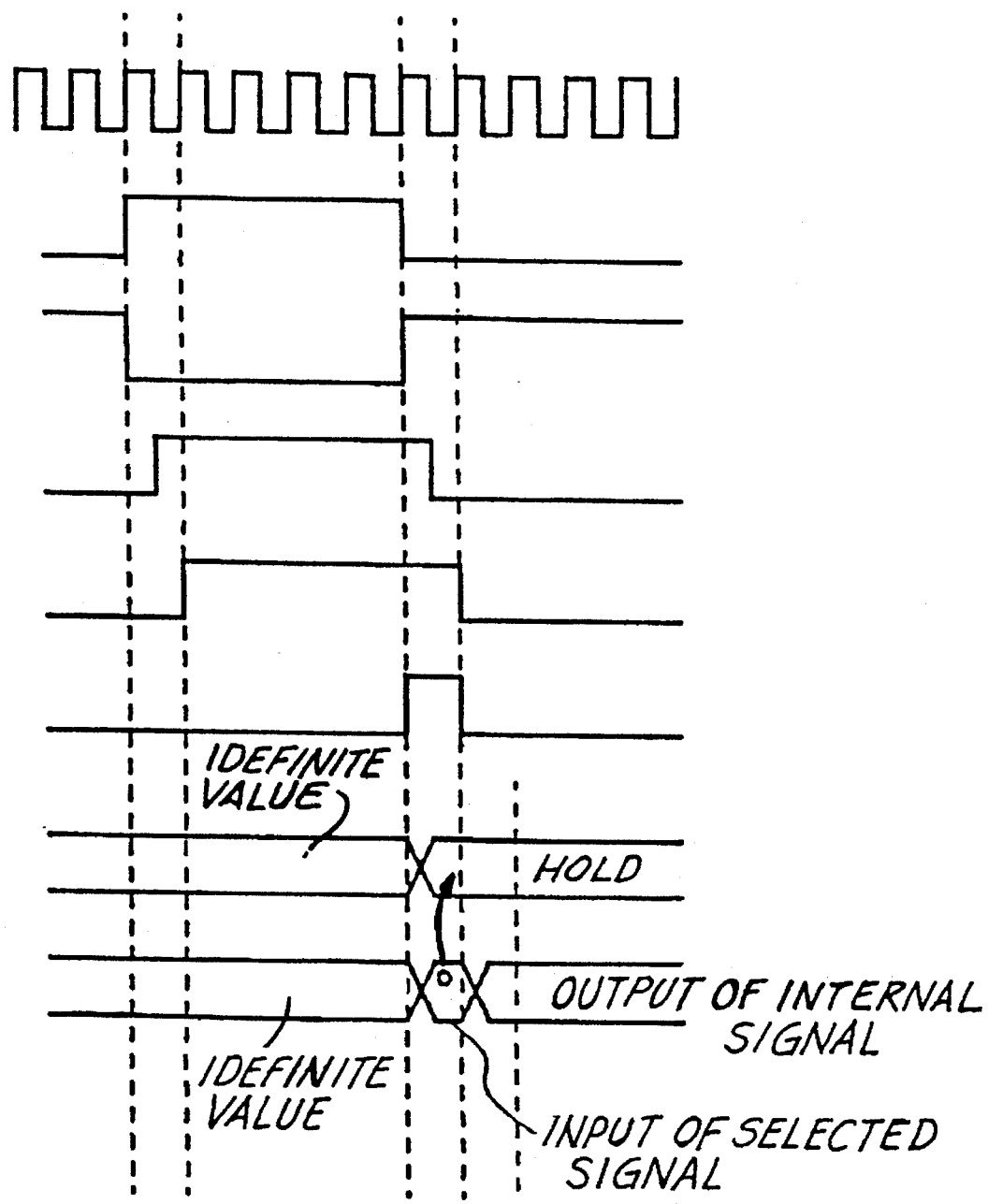
FIG. 9 is a diagram of signal waveforms for explaining the operation of the sixth embodiment.

With reference to FIG. 9 showing signal waveforms obtained by the trailing edge detection circuit 318, it is evident that the D flip-flop 403 supplies its output signal to the other D flip-flop 404 delayed by a half clock cycle from the leading edge of the reset signal due to the delay caused by the inverter 405.

Since the second D flip-flop 404 directly receives the clock signal at it clock input terminal CLK, it supplies its output to the other input terminal of the AND gate 402 at a timing further delayed by an additional half clock cycle, that is, delayed by one clock cycle from the leading edge of the reset signal. As a result, the output of the AND gate 402, namely, the latch signal 319, is "1" only for the duration of one clock cycle immediately after the fall of the reset signal, as shown in FIG. 9.

By supplying test mode signals from outside to the input-output terminals 301 and 302 during this period, the test mode signals are inputted into the decoder 315, because the three-state-buffers 313 and 314 maintain a high impedance state during the above period of one clock cycle due to the delay caused by the inverter 320. On the other hand, the decoded output of the decoder 315 is held in the latch 316 in response to the latch signal 319.

Although the latch signal 319 turns to "0" in the next clock cycle, the latch 316 holds its contents until the next latch signal 319 turns to "1". Therefore, latch outputs 321 to 324 remain the decoded outputs of the test mode signals previously inputted as they are. Responding to these latch outputs 321 to 324, the selector 303 selectively supplies one of the internal signals 305 to 308 and the selector 304 selectively supplies one of the internal signals 309 to 312 to the three-state-buffers 313 and 314, respectively.

In this state, the latch signal 319 maintains a "0" value to maintain low impedance and the conductive state of the three-state-buffers 313 and 314. Consequently, internal signals transmitted to the three-state-buffers 313 and 314 are outputted to the input-output terminals 301 and 302.

As is evident from comparison with the first embodiment, according to the present embodiment, it is possible to halve the number of external connection terminals for testing. That is, as described above, the reset terminal 317 of this embodiment (FIG. 7) can be composed of the terminals originally provided in the LSI so that the number of terminals is not increased.

Figure 10:
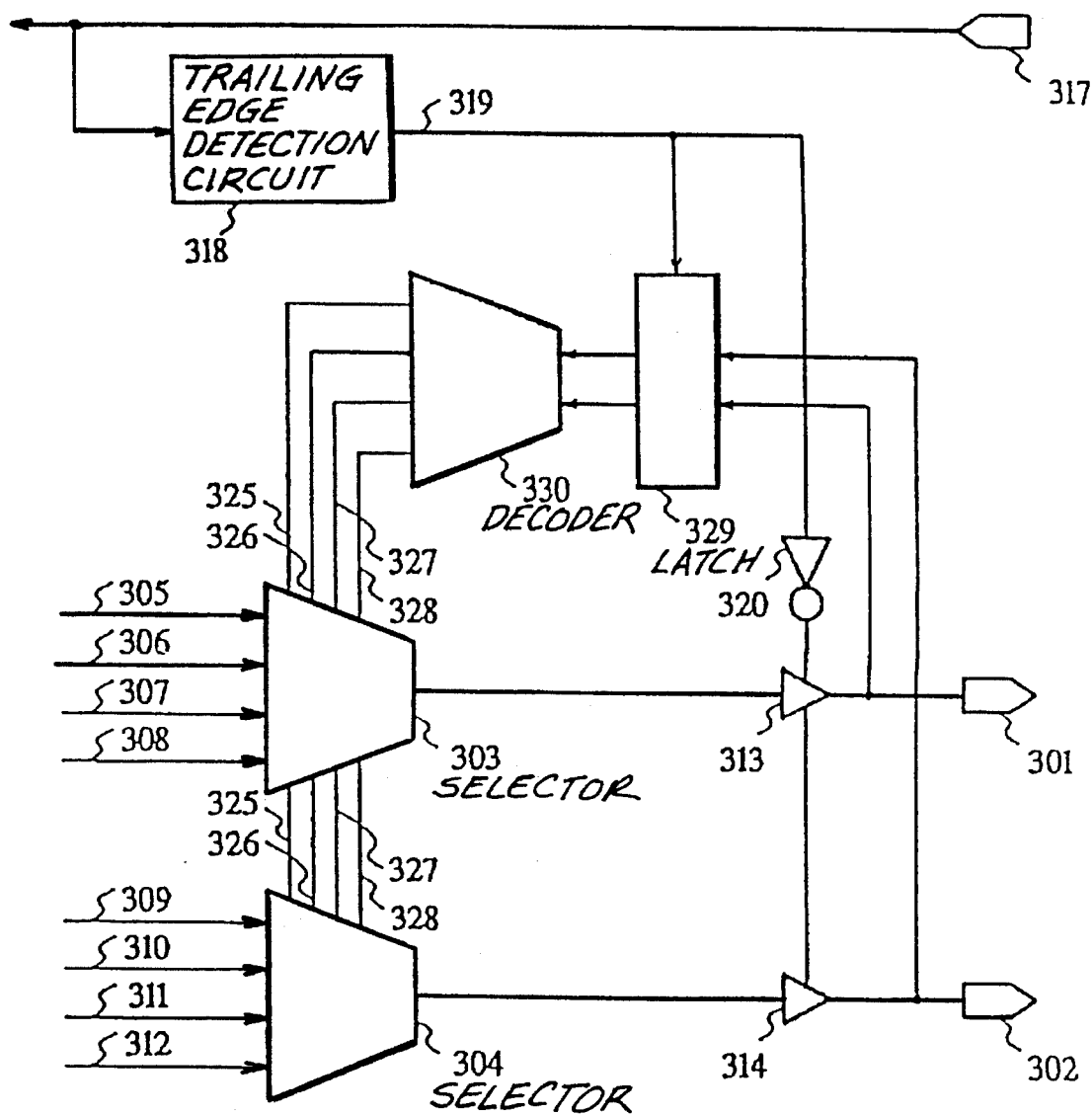
FIG. 10 is a circuit diagram of a seventh embodiment of the present invention.

The latch 316 in the above sixth embodiment (FIG. 7) may be disposed at the rear of the decoder 315 instead of being disposed at the front thereof, as shown in the seventh embodiment in FIG. 10. In the seventh embodiment, since the latch 329 latches parallel two-bit test mode signals from the input-output terminals 301 and 302, only one half of the rows of the latch 316 used in the sixth embodiment (FIG. 7) is sufficient for the latch 329. The decoder 330 of the seventh embodiment decodes the output of the latch 329 and outputs decoded outputs 325 to 328 to the selectors 303 and 304.

Figure 11:
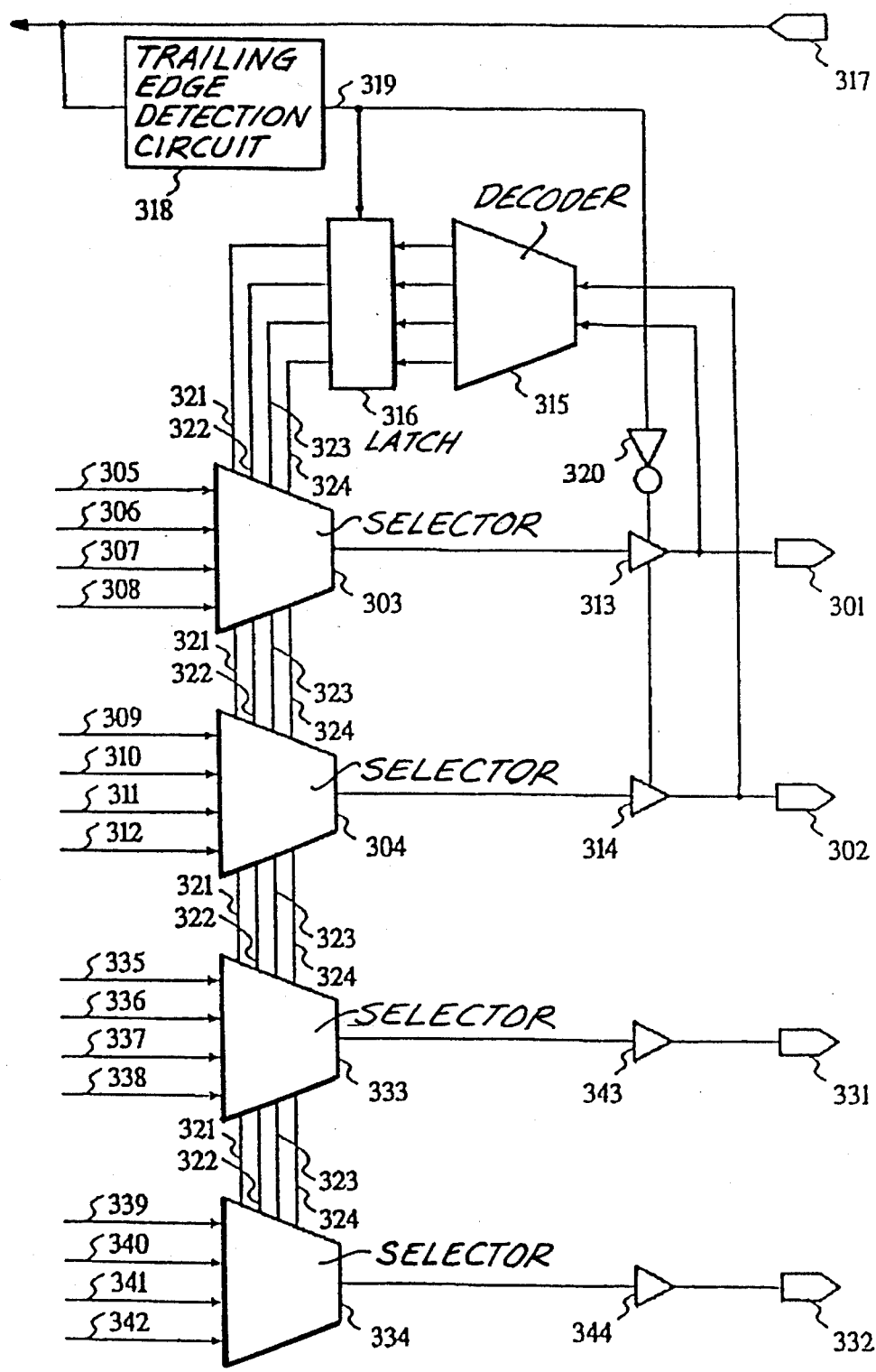
FIG. 11 is a circuit diagram of an eighth embodiment of the present invention.

In the sixth and seventh embodiments, the same terminals are used for the test signal output terminals and the test mode signal input terminals; however, when there are fewer test mode signal input terminals than test signal output terminals, the above terminal function is satisfied by using the same number of test signal output terminals as is required for the test mode signal input terminals, as shown for the eighth embodiment in FIG. 11. That is, the test signal output terminals 331 and 332 of the present embodiment have nearly the same function as the test signal output terminals 101, 102, 201, 207 and 222 to 225 in all of the embodiments from the first embodiment to the fifth embodiment.

Figure 12:
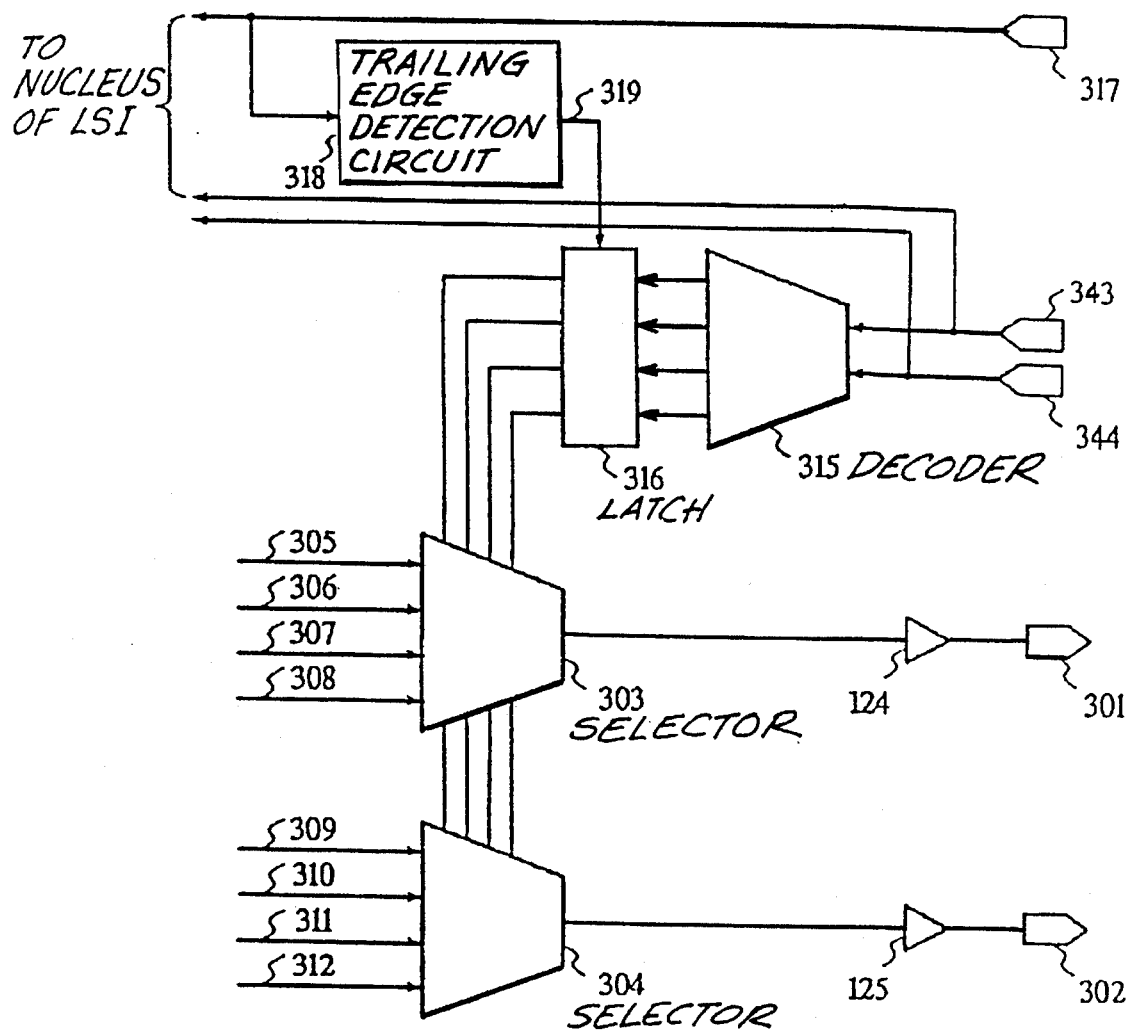
FIG. 12 is a circuit diagram of a ninth embodiment of the present invention.

In the above sixth and eighth embodiments the LSI is not raised to the operating state for at least one clock cycle immediately after the trailing edge of the reset signal, and by making use of this state, test mode signals are inputted to the decoder during this period. As shown in FIG. 12, the ninth embodiment, which is based on the above idea, employs two normal terminals 343 and 344 as test mode signal input terminals. Here, the normal terminal refers to an external connection terminal for input-output use of normal signals exchanged between the LSI and external circuits, The present embodiment appropriates two of these normal terminals for inputting test mode signals.

In the present embodiment, since test signal output terminals are not also used for test mode signal input terminals, as shown in the above sixth embodiment, the two three-state-buffers 313 and 314 and the inverter 320 in the sixth embodiment are not necessary, and the output gates 124 and 125 of the first embodiment are sufficient for the purpose. The input-output switching circuit of the present embodiment only consists of the trailing edge detection circuit 318.

However, since it is necessary to maintain test mode signals transmitted from normal terminals 343 and 344 until the selectors 303 and 304 select one of the internal signals 305 to 308 and 309 to 312, a latch 316 is also needed together with the trailing edge detection circuit 318, because normal terminals 343 and 344 exchange normal signals in the above test mode signal holding period and it is not possible to also use them for the input of test mode signals during that period.

The trailing edge detection circuit 318 and latch 316 of the present embodiment are identical to those of the sixth and eighth embodiments, and signal waveforms of respective parts of these components are also basically the same as those shown in FIG. 9, and consequently, no description will be made of them.

It is possible to construct a compound test signal output circuit of this type by combining the components of each of the above sixth through ninth embodiments and the components of each of the above second through fifth embodiments.

As described above, according to the present invention, the number of output terminals for the extraction of test signals from the LSI in the operating state can be reduced to a minimum. For example, when it is necessary to concurrently observe and test two sets having eight internal signals, conventional techniques have required that the number of connection terminals be increased by eight, whereas in the first embodiment above, only four additional terminals are needed, and in the sixth or the ninth embodiment, only two additional terminals are needed to achieve the object.

As described above, the number of external connection terminals of an LSI is subject to a number of limitations, and hence the present invention has a remarkable advantage in that it makes possible the extraction of many internal signals for test use without exceeding these limitations.

Although the invention has been concretely described in the embodiments above, variations in the embodiments may be made without departing from the scope of the present invention as defined in the appended claims.

What is claimed is:

1. A test signal output circuit provided in an LSI, comprising:

test signal output terminals;

test mode signal input terminals;

at least one selector for transmitting fixed internal signals selectively to said test signal output terminals in response to input signals directed to said test mode signal input terminals;

signal terminals composed of at least a portion of said test signal output terminals and said test mode signal input terminals for combined use in a timesharing manner;

a trailing edge detection circuit for detecting the trailing edge of a reset signal for resetting the entire LSI;

an input-output switching circuit for switching said signal terminals between a test mode signal input mode that receives test mode signals and a test mode signal output mode that outputs test signals, said switching occurring in response to trailing edges detected by said trailing edge detection circuit;

a decoder; and a latched circuit for holding the outputs of said decoder or test mode signals from said test mode signal input terminals in response to the output of said trailing edge detection circuit; wherein the output of said selector is controlled by responses to the output of said latched circuit.

2. A test signal output circuit provided in an LSI comprising:

test signal output terminals;

test mode signal input terminals;

at least one selector for transmitting fixed internal signals selectively to said test signal output terminals in response to input signals directed to said test mode signal input terminals;

signal terminals composed of at least a portion of designated normal terminals and said test mode signal input terminals for combined use in a timesharing manner;

a trailing edge detection circuit for detecting the trailing edge of a reset signal for resetting the entire LSI;

an input-output switching circuit for switching said signal terminals between a test mode signal input mode which receives test mode signals and a normal mode which exchanges normal signals, said switching occurring in response to trailing edges detected by said trailing edge detection circuit;

a decoder; and a latched circuit for holding the outputs of said decoder or test mode signals from said test mode signal input terminals in response to the output of said trailing edge detection circuit; wherein the output of said selector is controlled by responses to the output of said latched circuit.

* * * * *